(12) United States Patent
Lyon et al.

(10) Patent No.: US 6,309,760 B1
(45) Date of Patent: Oct. 30, 2001

(54) BEARING MATERIAL

(75) Inventors: John Lyon, Prestwick; Fatima Rutherford, Stewarton, both of (GB)

(73) Assignee: Dana Corporation, Toledo, OH (US)

( * ) Notice: Subject to any disclaimer, the term of this patent is extended or adjusted under 35 U.S.C. 154(b) by 0 days.

(21) Appl. No.: 09/428,244

(22) Filed: Oct. 27, 1999

(30) Foreign Application Priority Data

Oct. 27, 1998 (GB) .................................................. 9823349

(51) Int. Cl.⁷ .............................. B32B 15/01; C22C 13/00
(52) U.S. Cl. .................... 428/646; 428/935; 428/938; 420/557; 384/912
(58) Field of Search ..................... 428/646, 935, 428/938; 420/557; 384/625, 912

(56) References Cited

U.S. PATENT DOCUMENTS

| | | |
|---|---|---|
| 3,573,008 | 3/1971 | Akin . |
| 4,795,682 * | 1/1989 | Turner et al. ........................ 428/646 |
| 5,286,444 | 2/1994 | Tomikawa et al. . |
| 5,413,756 | 5/1995 | Sahu . |

FOREIGN PATENT DOCUMENTS

| | | |
|---|---|---|
| 3906402 | 9/1990 | (DE) . |
| 0 254 355 | 7/1987 | (EP) . |
| 0254355 | 1/1988 | (EP) . |
| 0320081 | 6/1989 | (EP) . |
| 1239862 | 7/1971 | (GB) . |
| 1523665 | 9/1978 | (GB) . |
| 2064584 | 6/1981 | (GB) . |
| 2285059 | 6/1995 | (GB) . |
| 2285266 | 7/1995 | (GB) . |
| 10-180480 | 11/1996 | (JP) . |

OTHER PUBLICATIONS

WPI Accession No. 87–317216/45 & JP 62224722.
WPI Accession No. 84–059361/10 & JP 59016992.
WPI Accession No. 82–98662E/46 & JP 57164952.
WPI Accession No. 81–88890D/48 & SU 808563.

* cited by examiner

Primary Examiner—Deborah Jones
Assistant Examiner—Bryant Young
(74) Attorney, Agent, or Firm—Rader, Fishman & Grauer PLLC

(57) ABSTRACT

A material for use as a bearing sliding surface and a bearing having the material are described, the material comprises tin and having therein from 1 to 5 wt % of a metal selected from the group comprising nickel, cobalt and iron.

15 Claims, 2 Drawing Sheets

BEARING MATERIAL

Figure 1:
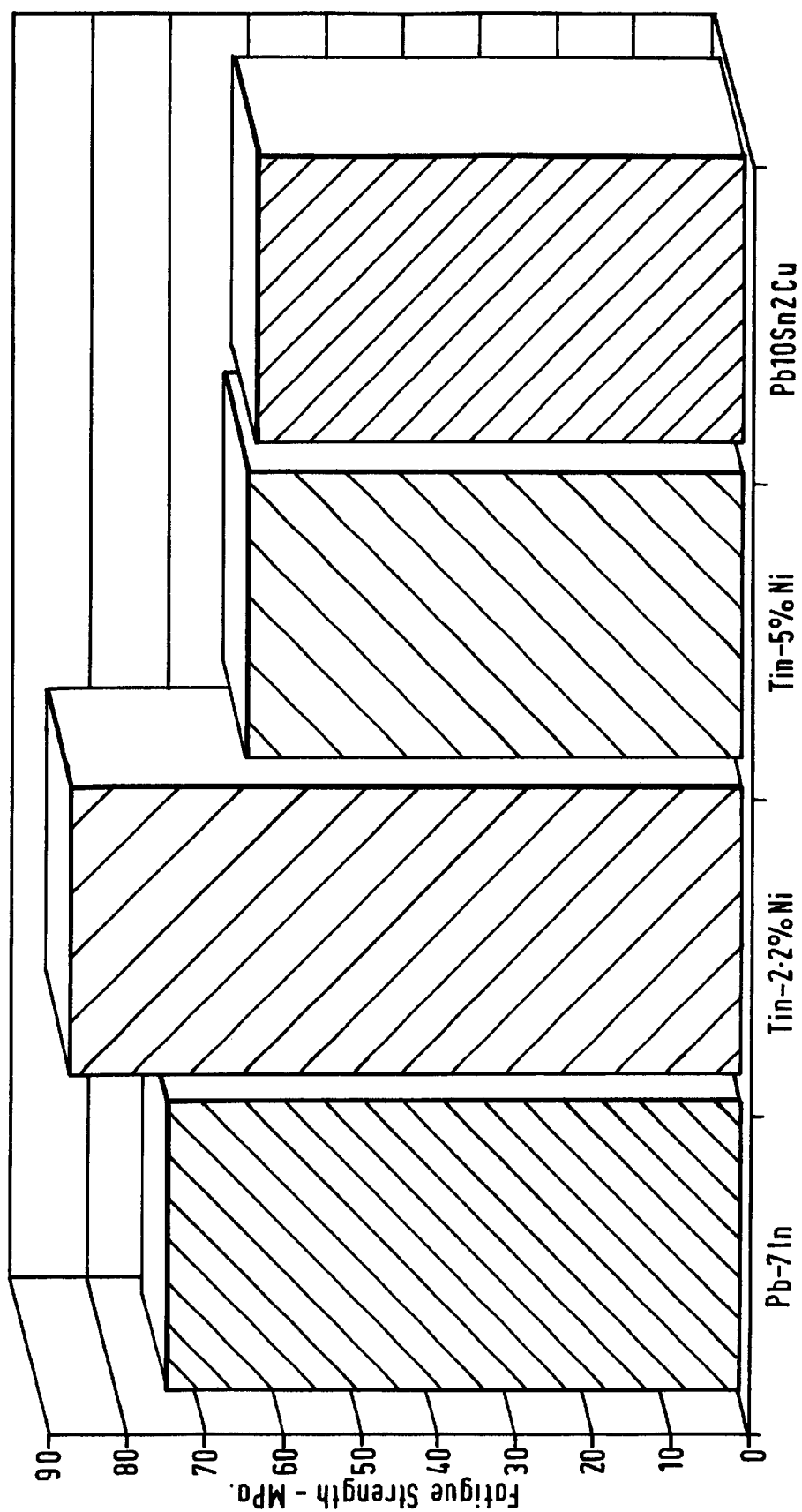

The present invention relates to bearing materials for plain sliding bearings and particularly, though not exclusively, to so-called overlay alloy layers which are deposited on the surface of a second, thicker layer of bearing alloy.

Plain bearings such as half bearing shells for internal combustion engine crankshaft connecting rod and main bearings for example frequently comprise at least three distinct layers: a first layer of a strong supporting material such as steel; a second layer of a bearing alloy bonded to the backing layer comprising a copper-lead based alloy or an aluminium-tin based alloy for example; and, a third, thinner layer and generally softer than the second layer, of a so-called overlay alloy which endows the bearing with properties of inter alia conformability and dirt embedability.

Many known overlay alloy systems contain high proportions of lead and include such systems as lead-indium, lead-tin and lead-tin-copper for example. It is a possibility that environmental legislation will render the use of lead in overlay alloys unacceptable at some time in the future. The problem is two-fold: firstly; there is the problem of dealing with lead containing effluents and residues generated as a result of electro-deposition of the overlays from electrolytes; and secondly there is the problem of the lead containing bearings themselves which may present an environmental hazard when vehicles are scrapped.

Pure tin coatings have been used in the past as so-called sacrificial coatings on the surface of plain bearings. These coatings have been very thin, about 2 to 3 $\mu$m, which is intended to wear away as a new engine "beds in". However, such sacrificial tin coatings have been deposited on top of other conventional overlay coatings such as those described above which are intended to remain for the life of the engine.

Tin-nickel electro-deposits have been known for decades, principally as decorative coatings to replace chromium coatings. The deposits are hard, intermediate between nickel and chromium, and have good corrosion resistance. Such coatings generally contain 30 to 35 wt % of nickel and comprise mainly the intermetallic compound, $Ni_3Sn_4$.

It is an object of the present invention to provide a lead-free material which may be used as a sliding bearing material for a plain bearing. It is a further object to provide a plain bearing having a lead-free sliding bearing material coating thereon.

According to a first aspect of the present invention there is provided a material for use as a bearing sliding surface, the material comprising tin and having therein from 1 to 5 wt % of a metal selected from the group comprising nickel, cobalt and iron.

In the text that follows references to "nickel" also include references to both "cobalt" and to "iron" except where reference is made to particular intermetallic compounds and in the specific examples hereinbelow.

Preferably, the nickel content may be from 1.5 to 3.5 wt %.

More preferably still, the nickel content may be from 2 to 3 wt %.

The lower limit of 1 wt % nickel is chosen because below this level the strengthening effect of the nickel is insufficient to endow adequate fatigue and/or wear resistance. Above 5 wt % nickel, the alloy becomes relatively hard and brittle for use as a soft bearing material, particularly where used as an overlay coating, and also the fatigue strength thereof tends to decline above this level.

The material may be deposited directly on to a strong supporting material backing such as steel but more preferably may be deposited on a layer of another harder (harder than the overlay alloy) bearing material which is itself bonded to a strong backing material such as steel for example. The harder bearing material may be any known bearing material suitable for the intended operating application. However, an aluminium alloy based bearing material is preferred since this combination may provide a completely lead-free bearing.

The material according to the present invention may be deposited by an electroplating route or by a physical vapour deposition route such as cathodic sputtering for example.

The form of the alloy in its as-deposited state is a solid solution of the nickel in the tin matrix. However, this is a metastable form and the stable form is a tin matrix having a dispersion of $Ni_3Sn_4$ intermetallic compound therein. The intermetallic compound does precipitate out at temperatures in excess of 100° C. X-ray diffraction work has shown that some $Ni_3Sn_4$ is present after 14 hours at 160° C. but not after 10 hours at this temperature. However, the size of the precipitate is very small which tends to strengthen the coating providing good fatigue and wear resistance but still endowing the coating with a low hardness of 18 $H_k$ (1 g Knoop indenter) so that the desired properties of conformability and dirt embedability are not impaired. For comparison, the hardness of lead-9 wt % tin is $8H_k$ and that of lead-10 wt % tin-2 wt % copper is $15H_k$.

When used as a bearing sliding surface directly on a steel backing for example, the thickness may lie in the range from 50 to 75 $\mu$m for example. When used as an overlay coating on a substrate of another, harder bearing material, the thickness may lie in the range from about 5 to 50 82 m with a range of about 10 to 20 $\mu$m being preferred. If used as a thin sacrificial surface coating as described above, the thickness may be in the range from about 1 to 5 $\mu$m.

When deposited onto the surface of another bearing alloy there may be an interlayer of pure nickel, copper or copper alloy (eg copper-zinc) for example to act either as a diffusion barrier and/or to enable the bearing material according to the present invention to be more adherent to the surface thereof.

According to a second aspect of the present invention, there is provided a plain bearing having a sliding surface comprising the bearing material of the first aspect of the present invention.

Figure 2:
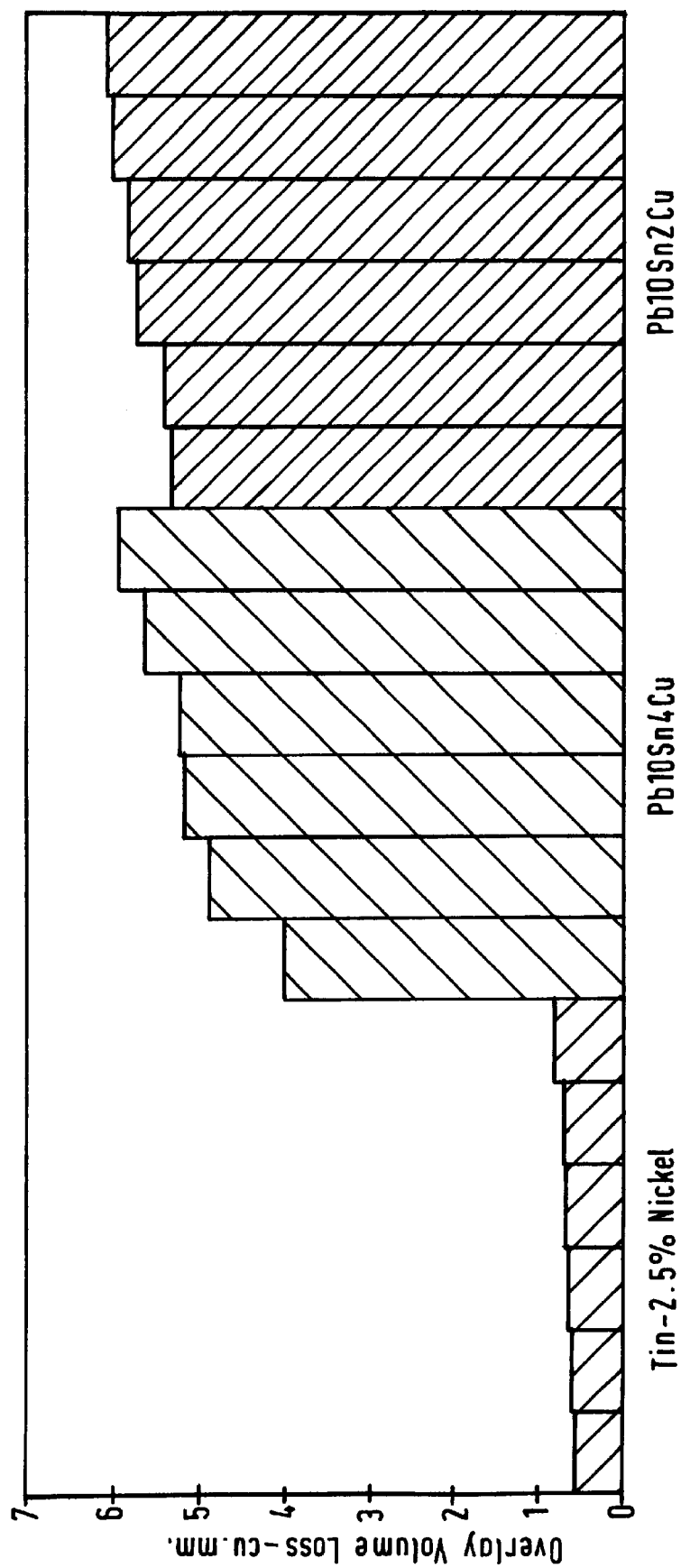

In order that the present invention may be more fully understood, an example will now be described by way of illustration only with reference to the accompanying drawings, of which:

FIG. 1 shows a histogram of fatigue test results for a material according to the present invention compared with other known overlay materials; and FIG. 2 which shows a histogram of wear test results of materials according to the present invention compared with other known bearing overlay materials.

Bearings having deposits of tin-2.2/2.5 wt % nickel were produced by electroplating in a plating bath having an electrolyte comprising:

| | |
|---|---|
| Stannous chloride | 26 g/l |
| Nickel chloride | 2.5 g/l |
| Potassium pyrophosphate | 192 g/l |
| Glycine | 20 g/l |
| Anode material | nickel |

-continued

| The plating conditions were: | |
|---|---|
| Cathode current density | 1.0 ASD |
| Temperature | 50° C. |
| pH | 8.4 |

The bearings produced comprised a steel backing having a layer of aluminium-silicon alloy based bearing material thereon and also having an approximately 1 μm thick pure nickel interlayer thereon and on which the overlay bearing material according to the present invention was deposited according to the conditions described above. The wall thickness of the bearings was approximately 1.8 mm and included a layer of the inventive alloy about 20 μm thick.

The bearings produced were tested for fatigue strength in a known "Sapphire" testing machine. The results of theses tests is given in Table 1 below:

TABLE 1

| | Sapphire Fatigue Strength- MPa | | |
|---|---|---|---|
| Overlay | Hard Tin | Tin-2.2Nickel | Tin-5Nickel |
| Substrate | Al/Si alloy | Al/Si alloy | Al/Si alloy |
| Fatigue Strength Mpa | 76 | 97 | 83 |
| | 55 | 83 | 62 |
| | 55 | 90 | 62 |
| | 0 | 83 | 55 |
| | 83 | 83 | 79 |
| | 76 | 83 | 55 |
| Average Fatigue Strength- MPa | 69 | 86.5 | 64 |

As may be seen from Table 1, the overlay comprising tin-2.2–2 wt % nickel has an average fatigue strength of 86.5 MPa which is greater than the so-called hard tin coating known in the prior art and also the tin-5 wt % nickel overlay coating also tested. These results are shown in the histogram of FIG. 1 where it may be seen that the tin-2.2 wt % material is also stronger than both lead-7wt % indium and lead-10 wt % tin-2 wt % copper overlays which have heretofore been considered to be amongst the strongest of the available overlay alloys known in the art.

FIG. 2 shows a histogram comparing wear test results of alloys comprising tin-2.5 wt % nickel according to the present invention; lead-10 wt % tin-4 wt % copper and lead-10 wt % tin-2 wt % copper. It may be seen that over several tests the wear rate of the alloy according to the present invention is a factor of at least 5 or more lower than the two comparative alloys. Experience has shown that in bearing tests in actual engines the difference is likely to be closer to a factor of 2.

The test conditions were:

| Imposed load | 2.7 kg |
|---|---|
| Oil type | Visco 15W40 |
| Oil temp. | 140° C. |
| Duration | 30 min. |
| Shaft speed (rev/min) | 1000 |
| Surface finish (Ra) | 0.11 |

-continued

| Shaft diameter | 45 mm |
|---|---|
| Bearing internal diameter | 52.8 mm |

What is claimed is:

1. A composition of material suitable for use as a sliding surface of a bearing, the material being comprised of a tin matrix and including from about 1–5% by weight of a metal selected from the group consisting of nickel, cobalt and iron, wherein said metal is in the form of an intermetallic precipitate with tin in said matrix.

2. A composition of material according to claim 1, wherein the metal comprises from about 1.5–3.5% by weight.

3. A composition of material according to claim 2, wherein the metal comprises from about 2–3% by weight.

4. A composition of material according to claim 1, said composition of material being deposited upon a second bearing material that is harder than said composition of material, wherein the composition is deposited upon said second bearing material using an electroplating technique.

5. A composition of material according to claim 1, said composition of material being deposited upon a second bearing material, wherein the composition is deposited upon said second bearing material using a vapor deposition technique.

6. A composition of material according to claim 5, wherein said vapor deposition technique includes cathodic sputtering.

7. A bearing having a sliding surface material comprised of a tin matrix and including from about 1–5% by weight of a metal selected from the group consisting of nickel, cobalt and iron, wherein said metal is in the form of an intermetallic precipitate with tin in said matrix.

8. A bearing according to claim 7, wherein the metal comprises from about 1.5–3.5% by weight.

9. A bearing according to claim 8, wherein the metal comprises from about 2–3% by weight.

10. A bearing according to claim 7, wherein the sliding surface is formed in connection with said bearing using an electroplating technique.

11. A bearing according to claim 7, wherein the sliding surface is formed in connection with said bearing using a vapor deposition technique.

12. A bearing according to claim 11, wherein said vapor deposition technique includes cathodic sputtering.

13. A composition of material suitable for use as a sliding surface of a bearing, the material being comprised of a tin matrix and including from about 1–5% by weight of a metal selected from the group consisting of nickel, cobalt and iron, said composition being deposited upon a second bearing material, said second bearing material being harder than said composition of material, wherein the composition is deposited upon said second bearing material using an electroplating technique, and further wherein said metal is in the form of an intermetallic precipitate with tin in said matrix.

14. A bearing according to claim 7, wherein said sliding surface material is deposited upon a second bearing material, said second bearing material being harder than said sliding surface material.

15. A bearing according to claim 14, wherein said second bearing material is an aluminum alloy.

* * * * *